United States Patent
Jaeck

(10) Patent No.: US 7,563,645 B2
(45) Date of Patent: Jul. 21, 2009

(54) ELECTRONIC PACKAGE HAVING A FOLDED PACKAGE SUBSTRATE

(75) Inventor: Edward W. Jaeck, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 11/270,936

(22) Filed: Nov. 10, 2005

(65) Prior Publication Data

US 2006/0060962 A1 Mar. 23, 2006

Related U.S. Application Data

(62) Division of application No. 10/623,073, filed on Jul. 17, 2003, now Pat. No. 6,992,376.

(51) Int. Cl.
*H01L 21/44* (2006.01)

(52) U.S. Cl. ............... 438/117; 257/686; 257/E21.614

(58) Field of Classification Search ................. 438/106, 438/117; 29/832; 257/686, 723, 724, E21.614
See application file for complete search history.

(56) References Cited

U.S. PATENT DOCUMENTS

| 4,834,660 | A | * | 5/1989 | Cotti ........................... 439/67 |
| 5,224,023 | A | * | 6/1993 | Smith et al. .................. 361/784 |
| 5,436,744 | A | * | 7/1995 | Arledge et al. ............... 349/150 |
| 5,639,990 | A | * | 6/1997 | Nishihara et al. ........... 174/52.2 |
| 6,136,468 | A | * | 10/2000 | Mitchell et al. ............. 429/110 |
| 6,225,688 | B1 | * | 5/2001 | Kim et al. ................... 257/686 |
| 6,300,679 | B1 | * | 10/2001 | Mukerji et al. .............. 257/738 |
| 6,376,769 | B1 | * | 4/2002 | Chung ......................... 174/52.2 |
| 6,444,921 | B1 | * | 9/2002 | Wang et al. .................. 174/260 |
| 6,600,222 | B1 | * | 7/2003 | Levardo ...................... 257/686 |
| 6,770,813 | B1 | * | 8/2004 | Ramsagar et al. .......... 174/52.1 |
| 6,869,825 | B2 | * | 3/2005 | Chiu ........................... 438/106 |
| 7,246,431 | B2 | * | 7/2007 | Bang et al. ................... 29/835 |
| 2002/0164838 | A1 | * | 11/2002 | Moon et al. .................. 438/107 |
| 2003/0067064 | A1 | * | 4/2003 | Kim ............................ 257/686 |
| 2004/0097086 | A1 | * | 5/2004 | Igarashi et al. .............. 438/690 |
| 2004/0113275 | A1 | * | 6/2004 | Karnezos ..................... 257/758 |
| 2004/0115866 | A1 | * | 6/2004 | Bang et al. .................. 438/125 |
| 2004/0124527 | A1 | * | 7/2004 | Chiu ........................... 257/723 |
| 2004/0218848 | A1 | * | 11/2004 | Shen et al. ..................... 385/14 |

(Continued)

FOREIGN PATENT DOCUMENTS

JP 2003-197693 * 7/2003

*Primary Examiner*—Quoc D Hoang
(74) *Attorney, Agent, or Firm*—Blakely, Sokoloff, Taylor & Zafman LLP

(57) ABSTRACT

An electronic package of the kind having a folded substrate is provided. The substrate is configured so that a stress concentration is created where folding is desired. In the present example, the stress concentration is created with first a resilient metal ground layer that resists bending and has an edge that promotes the creation of a stress concentration in a flexible layer at or near the edge. A second metal ground layer resists bending in another portion of the substrate, and also has an edge creating a stress concentration in a different area of the flexible layer. The portions of the substrate having the first and second resilient metal ground layers can be folded over one another with substantially no bending in these portions, while a fold portion between the edges bends to allow for folding of the substrate.

2 Claims, 3 Drawing Sheets

U.S. PATENT DOCUMENTS

2004/0238936 A1* 12/2004 Rumer et al. ............... 257/688
2004/0264148 A1* 12/2004 Burdick et al. .............. 361/748
2005/0095745 A1* 5/2005 Sapir .......................... 438/106

* cited by examiner

ELECTRONIC PACKAGE HAVING A FOLDED PACKAGE SUBSTRATE

CROSS-REFERENCE TO OTHER APPLICATIONS

This is a divisional of U.S. patent application Ser. No. 10/623,073, filed on Jul. 17, 2003 now U.S. Pat. No. 6,992,376.

BACKGROUND OF THE INVENTION

1). Field of the Invention

This invention relates to an electronic package having a folded, flexible substrate, and to a method of constructing such an electronic package.

2). Discussion of Related Art

Integrated circuits are usually manufactured on semiconductor wafers that are subsequently singulated into individual dies. Such a die may be extremely thin, often less than 100 microns, and is subsequently mounted to a package substrate for purposes of structural integrity. The package substrate also has conductors in the form of traces thereon, metal lines therein, and/or vias therein to provide electric interconnection to other devices, often other integrated circuits or other dies.

In order to save space in x and y, it is often required to stack more than one die on top of one another in a z-direction, with the integrated circuits of the dies interconnected with one another. Two dies can, for example, be mounted to a flexible package substrate, and the flexible package substrate be folded into positions such that the dies are above one another.

A package substrate of the aforementioned kind is usually uniformly flexible across its width. When one portion of the package substrate is folded over another portion of the package substrate, a fold region may be created at an undesired, even arbitrary area of the package substrate. Folding of the substrate at undesired areas may cause damage to certain components of the substrate. Bending at arbitrary locations may cause inconsistencies in bending from one assembly to the next, which may result in incorrect downstream packaging. Uncontrolled folding may also result in an undesired form factor of the final electronic package.

BRIEF DESCRIPTION OF THE DRAWINGS

The invention is described by way of example with reference to the accompanying drawings, wherein.

DETAILED DESCRIPTION OF THE INVENTION

An electronic package of the kind having a folded substrate is provided. The substrate is configured so that a stress concentration is created where folding is desired. In the present example, the stress concentration is created with first a resilient metal ground layer that resists bending and has an edge that promotes the creation of a stress concentration in a flexible layer at or near the edge. A second metal ground layer resists bending in another portion of the substrate, and also has an edge creating a stress concentration in a different area of the flexible layer. The portions of the substrate having the first and second resilient metal ground layers can be folded over one another with substantially no bending in these portions, while a fold portion between the edges bends to allow for folding of the substrate. Bending of the fold portion is also promoted because the fold portion is not as thick as the portions having the resilient metal ground layers. Another embodiment may make use of a different mechanism to create one or more stress concentrations.

Figure 1:
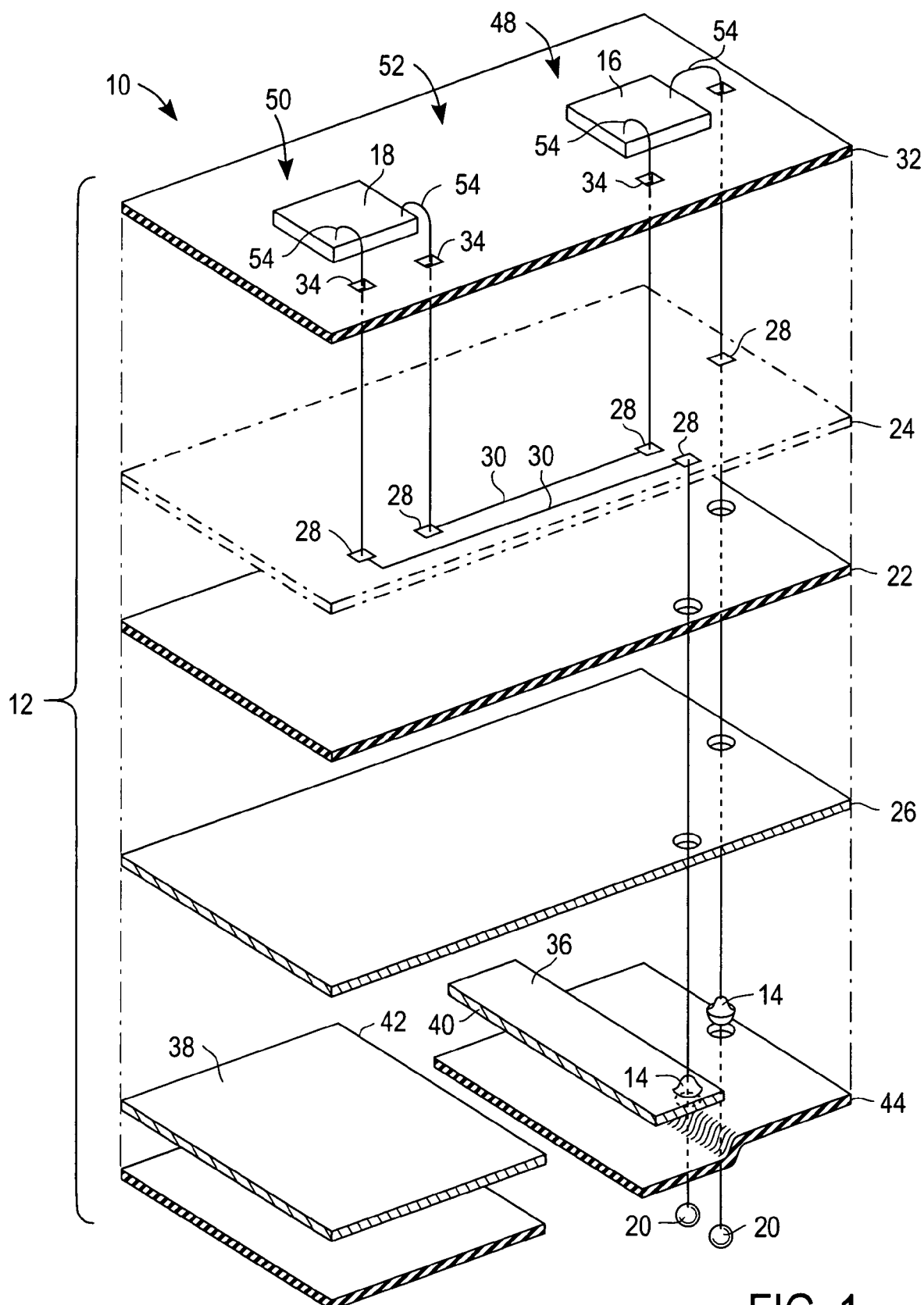
FIG. 1 is a perspective view illustrating an electronic package, according to an embodiment of the invention, with a package substrate thereof shown in exploded form.

FIG. 1 of the accompanying drawings illustrates components of an electronic package 10, according to an embodiment of the invention, including various layers of a package substrate 12 before being folded, vias 14 formed in some layers of the package substrate 12, first and second electronic devices 16 and 18 mounted to the package substrate 12, and solder ball terminals 20 that are attached to the package substrate 12.

Resilient Metal Ground Planes for Controlled Folding

A core of the package substrate 12 is a flexible layer 22 made of polyimide, an insulator. First and second thin metal layers 24 and 26 are formed on upper and lower surfaces of the flexible layer 22, respectively. The thin metal layers 24 and 26 are initially uniformly formed over the length and width of the flexible layer 22. The thin metal layers 24 are then patterned so that areas are removed and other areas, including contacts 28 and traces 30, remain behind.

A first solder mask 32 is formed over the remaining portions of the first thin metal layer 24. Areas 34 of the first solder mask 32 are selectively removed in an etching process, to expose the contacts 28 of the first thin metal layer 24. The combination of the flexible layer 22, the first and second thin metal layers 24 and 26, and the first solder mask 32 is still relatively flexible and can be folded at any desired location.

First and second resilient ground metal layers 36 and 38, respectively, are then plated on select areas on a lower surface of the second thin metal layer 26. The first and second resilient ground metal layers 36 and 38 are in the same plane. The first resilient ground metal layer 36 has a left edge 40. The second resilient ground metal layer 38 is plated to the left of the first resilient ground metal layer 36 and has a right edge 42. The edges 40 and 42 are in a parallel, spaced, and facing relationship relative to one another. As will be described in more detail herein, the first and second ground metal layers 36 and 38 rigidify portions of the package substrate 12 that they form part of, to resist bending of the portions that they form part of, while still allowing for folding of other portions of the package substrate 12.

A second solder mask 44 is subsequently formed on lower surfaces of the first and second resilient ground metal layers 36 and 38. The second solder mask 44 is also formed on some exposed areas of the second thin metal layer 26. In the present example, the second solder mask 44 is not formed on exposed areas of the second thin metal layer defined between the edges 40 and 42.

The solder ball terminals 20 are attached to a lower side of the package substrate 12, and the first and second electronic devices 16 and 18 are mounted to an upper surface of the package substrate 12.

Figure 2:
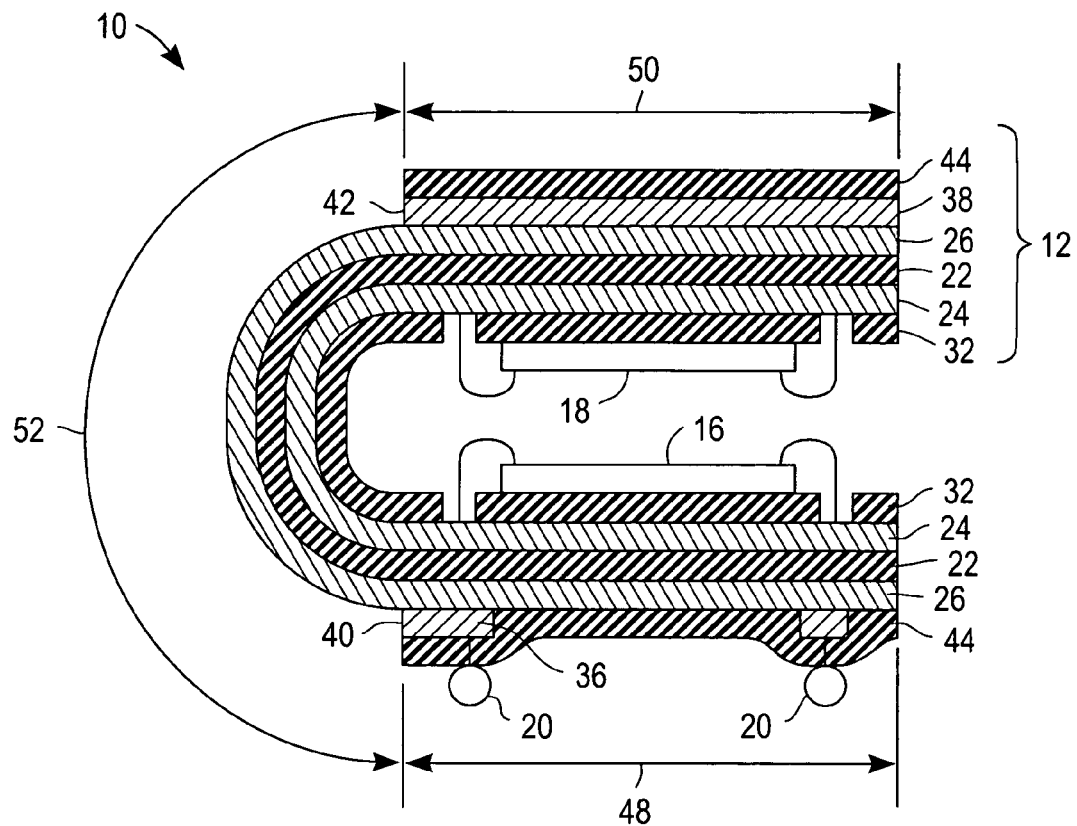
FIG. 2 is a cross-sectional side view of the electronic package after the package substrate is folded.

Reference is now made to FIG. 2. The package substrate can generally be divided into first and second portions 48 and 50, and a fold portion 52 between the first and second portions 48 and 50. The first portion 48 includes and extends up to the edge 40 of the first resilient ground metal layer 36. The second portion 50 includes and extends up to the edge 42 of the second resilient ground metal layer 38. The fold portion 52 extends from the edge 40 to the 42.

The electronic package 10 is illustrated after the package substrate 12 is folded at the fold portion 52. The second portion 50 is then in a plane above and parallel to the first portion 48. What should be noted is that the first and second resilient ground metal layers 36 and 38 resist bending or folding of the first and second portions 48 and 50. The fold portion 52 is, however, easily bent due to the absence of any resilient layers such as the first and second resilient ground metal layers 36 and 38, and also because the fold portion 52 is not as thick as the first or second portions 48 or 50.

It can thus be said that the first and second resilient ground metal layers, and in particular the edges 40 and 42 thereof, promote bending of the fold portion 52 from near the edge 40 to near the edge 42. A desired portion of the substrate 12 is thus bent, whereas other portions remain substantially flat.

Figure 3:
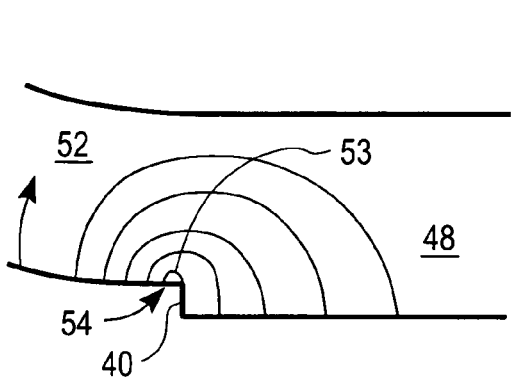
FIG. 3 is a side view illustrating a stress concentration that is formed in a portion of the package substrate near an edge of a resilient ground metal layer of the package substrate.

As illustrated in FIG. 3, a stress concentration 53 is created in the fold portion 52 near the edge 40. The stress concentration 53 is created because of the materials and geometry of the package substrate 12 in the region of the edge 40. A similar stress concentration is created in the fold portion near the edge 42 in FIG. 2. It should, however, be understood that other mechanisms may be employed to create a stress concentration that controls bending of a substrate such that a fold portion thereof is bent, whereas other portions thereof remain substantially flat.

Electric Interconnection

The first and second electronic devices 16 and 18 are microelectronic dies that include integrated circuits. Wirebonding wires 54 connect respective ones of lands (not shown) on each of the electronic devices 16 and 18 to respective ones of the contacts 28 of the first thin metal layer 24. The traces 30 all extend from the first portion 48 through the fold portion 52 to the second portion 50. Some of the traces 30 connect the second electronic device 18 to the first electronic device 16. Other ones of the traces 30 connect the second electronic device 18 through contacts 28 in the first portion 48 and the vias 14 to the solder ball terminals 20. The first electronic device 16 is also connected through the contacts 28 in the first portion 48 and some of the vias 14 to the solder ball terminals 20.

It can thus be seen that signals can be provided through the solder ball terminals 20 to and from either electronic device 16 or 18, and that signals can be transmitted between the electronic devices 16 and 18. Some of the vias 14 are also formed in the first resilient ground metal layer 36, and can be connected to either electronic device 16 or 18. Some of the solder ball terminals 20 are directly attached to the first resilient ground metal layer 36, and can provide a ground or reference voltage through the first resilient ground metal layer 36 to the electronic devices 16 and 18.

What is thus provided is a substrate which includes ground planes 36 and 38 for improved signal referencing and better controlled impedance. What should be noted is that although the ground planes 36 and 38 are relatively resilient, the substrate 12 is still foldable due to selective placement of the ground planes 36 and 38.

Figure 4:
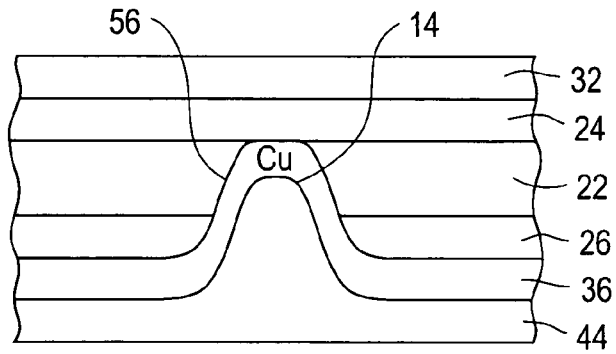
FIG. 4 is a cross-sectional side view illustrating how a via is plated when the resilient ground metal layer is plated.

FIG. 4 illustrates how one of the vias 14 in the first resilient ground metal layer 36 is formed. A via opening 56 is laser-drilled in the second thin metal layer 26, and the flexible layer 22. The via 14 is plated in the via opening 56 when the first resilient ground metal layer 36 is plated on the second thin metal layer 26. Processes exist in the art for plating metal on non-metal materials, such as the polyimide of the flexible layer 22. Other vias (not shown) may simultaneously be plated when the first resilient ground metal layer 36 is plated, but can be electrically isolated from the first resilient ground metal layer 36 for purposes of providing signals to or from the electronic devices 16 or 18.

Alternative Embodiment

In the embodiment of FIG. 1, the electronic devices 16 and 18 are mounted on the same side of the unfolded package substrate 12. As illustrated in FIG. 2, the electronic devices 16 and 18 are both on the inside of the folded package substrate 12.

Figure 5:
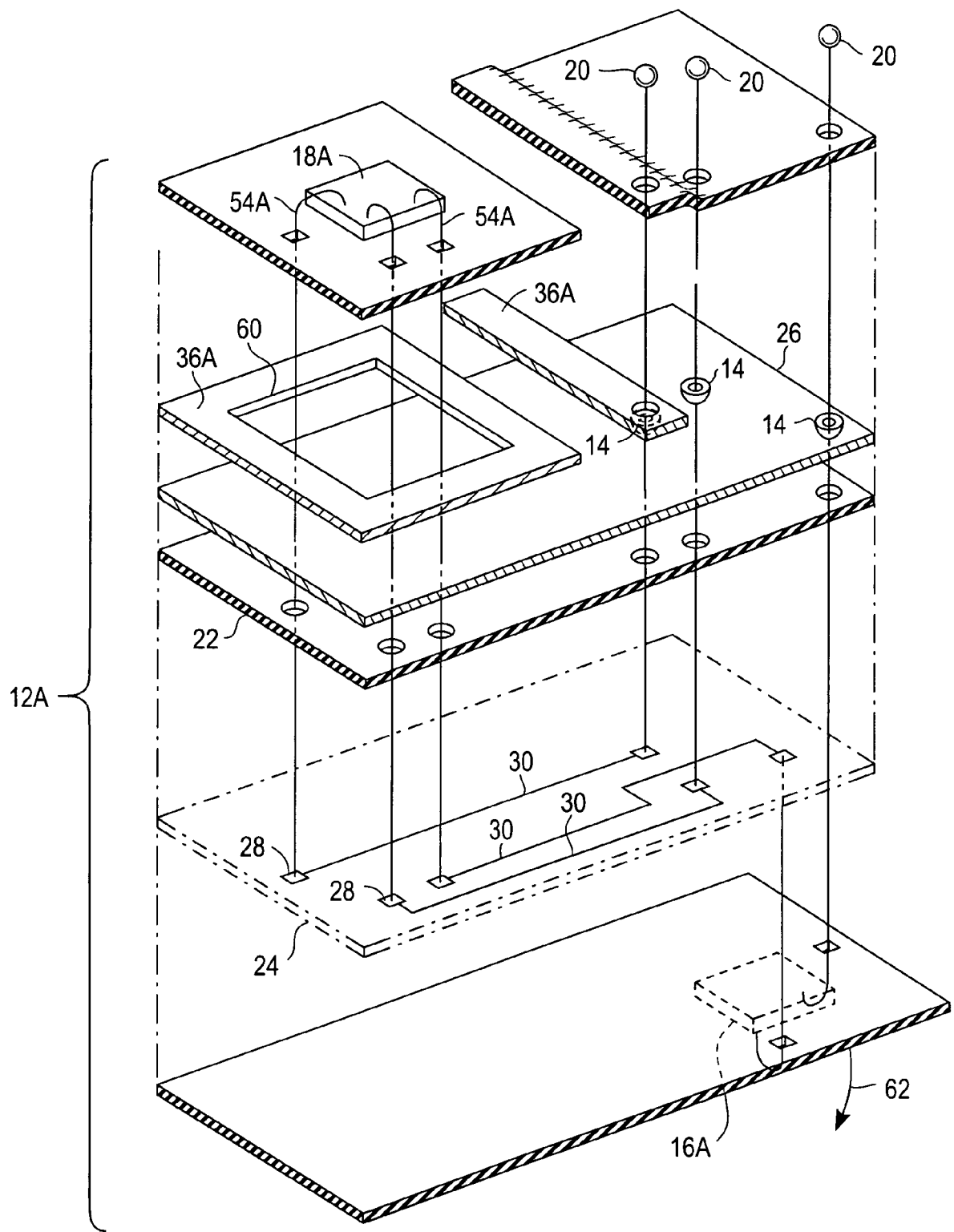
FIG. 5 is a perspective view of an electronic package, according to another embodiment of the invention, with a package substrate thereof shown in exploded form.

As illustrated in FIG. 5, electronic devices 16A and 18A may be mounted on opposing sides of an unfolded package substrate 12A. As with the embodiment of FIG. 1, the package substrate 12A may have first and second resilient ground metal layers 36A and 38A. The second resilient ground metal layer 38A may have a routing opening 60. Wirebonding wires 54A may extend from the second electronic devices 18A through the routing opening 60 and openings in a second thin metal layer 26 and a flexible layer 22 to contacts 28 of a first thin metal layer 24.

Like reference numerals used in FIGS. 1 and 5 indicate like components, and it should thus be evident that the package substrate 12A is the same as the package substrate 12 in all other respects. The package substrate 12A thus includes a first portion including the first resilient ground metal layer 36A, a second portion including the second resilient ground metal layer 38A, and a fold portion between the first and second resilient ground metal layers 36A and 38A.

Folding of the package substrate 12A in a direction 62 will place the first electronic device 16A on top of the first portion that includes the first resilient ground metal layer 36A, and the second electronic device 18A will be placed on top of the second portion that includes the second resilient ground metal layer 38A.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. For example, although reference is made to "metal," it should be understood that other conductive materials may be used instead of metal with similar effect.

What is claimed is:

1. A method of making an electronic package, comprising:
   layering a resilient ground layer onto at least a first portion of a substrate, wherein the resilient ground layer includes at least one edge;
   mounting at least a first electronic device, carrying a microelectronic circuit, to the first portion of the substrate, wherein at least one layer of the substrate is between the first electronic device and the resilient ground layer;
   mounting a second electronic device, carrying a microelectronic circuit, to a second portion of the substrate, wherein at least one layer of the substrate is between the second electronic device and the resilient ground layer;
   electrically connecting lands of the second electronic device to contacts on the second portion, the contacts being connected to the traces; and
   folding the second portion of the substrate over the first portion together with traces extending from the first portion to the second portion, the edge of the resilient ground layer promoting where the substrate is bent.

2. The method of claim 1, wherein the first and second portions each have a respectivce resilient layer having a respective edge, the edges jointly promoting bending of the substrate at a fold region between the edges.

* * * * *

UNITED STATES PATENT AND TRADEMARK OFFICE
CERTIFICATE OF CORRECTION

PATENT NO. : 7,563,645 B2  Page 1 of 1
APPLICATION NO. : 11/270936
DATED : July 21, 2009
INVENTOR(S) : Jaeck et al.

It is certified that error appears in the above-identified patent and that said Letters Patent is hereby corrected as shown below:

In column 5, at line 4 delete, "respectivce" and insert --respective--.

Signed and Sealed this

Eighth Day of June, 2010

David J. Kappos
*Director of the United States Patent and Trademark Office*